United States Patent [19]

Johnson et al.

[11] 4,350,991

[45] Sep. 21, 1982

[54] NARROW CHANNEL LENGTH MOS FIELD EFFECT TRANSISTOR WITH FIELD PROTECTION REGION FOR REDUCED SOURCE-TO-SUBSTRATE CAPACITANCE

[75] Inventors: William S. Johnson, Scotsdale, Ariz.; Ronald W. Knepper, LaGrangeville, N.Y.

[73] Assignee: International Business Machines Corp., Armonk, N.Y.

[21] Appl. No.: 51,465

[22] Filed: Jun. 22, 1979

Related U.S. Application Data

[60] Continuation of Ser. No. 867,559, Jan. 6, 1978, abandoned, which is a division of Ser. No. 711,947, Aug. 5, 1976, Pat. No. 4,078,947.

[51] Int. Cl.³ ............................................. H01L 29/78
[52] U.S. Cl. ........................................ 357/23; 357/20; 357/42; 357/89; 357/91
[58] Field of Search ................... 357/20, 23, 41, 42, 357/89, 91

[56] References Cited

U.S. PATENT DOCUMENTS

| | | | |
|---|---|---|---|
| 3,653,978 | 4/1972 | Robinson et al. | 357/23 |
| 3,745,425 | 7/1973 | Berg et al. | 357/23 |
| 3,891,468 | 6/1975 | Ito et al. | 357/23 |
| 3,895,390 | 7/1975 | Meiling et al. | 357/91 |
| 3,909,320 | 9/1975 | Cauge et al. | 357/23 |
| 3,926,694 | 12/1975 | Cauge et al. | 357/23 |
| 3,983,572 | 9/1976 | Johnson | 357/23 |
| 4,011,576 | 3/1977 | Uchida et al. | 357/23 |
| 4,017,888 | 4/1977 | Christie et al. | 357/23 |
| 4,021,835 | 5/1977 | Etoh et al. | 357/23 |
| 4,050,965 | 9/1977 | Ipri et al. | 357/23 |

Primary Examiner—Joseph E. Clawson, Jr.
Attorney, Agent, or Firm—John A. Jordan

[57] ABSTRACT

A method for fabricating an N-channel silicon MOS field effect transistor on a P-type substrate. The structure retains the natural isolation between devices and the consequent higher device density in an integrated circuit structure than conventional double diffused MOS field effect transistor devices. The device is fabricated by using ion implantation to create an N-type surface layer in the channel and then overcompensating this layer to create a P-type region near the source by ion implanting P-type ions into the source junction region. The source to substrate capacitance is considerably less than that of conventional double diffused MOS devices which provides an improved circuit performance.

4 Claims, 6 Drawing Figures

NARROW CHANNEL LENGTH MOS FIELD EFFECT TRANSISTOR WITH FIELD PROTECTION REGION FOR REDUCED SOURCE-TO-SUBSTRATE CAPACITANCE

This is a continuation of application Ser. No. 867,559 filed Jan. 6, 1978, abandoned, which was a division of Ser. No. 711,947 filed Aug. 5, 1976, now U.S. Pat. No. 4,078,947.

BACKGROUND OF THE INVENTION

The invention relates to methods and resulting devices for forming narrow channel length devices of the MOS field effect transistor type.

DESCRIPTION OF THE PRIOR ART

Performance of MOS field effect transistor devices have been improved by fabrication of progressively narrower channel lengths. As the channel lengths have become narrower, the speed of switching has increased. A technique has been developed to form a narrow channel MOS field effect transistor device using substantially conventional fabrication techniques by what is termed the double-diffused method. This method and resulting device is described in "D-MOS Transistor For Microwave Applications" by H. J. Sigg et al in Transactions on Electron Devices, Vol. ED 19 No. 1, January 1972 pp. 45–53, and "DMOS Experimental and Theoretical Study" by T. J. Rodgers et al, 1975 IEEE International Solid State Circuit Conference Digest, pp. 122 and 123. The resulting device is an N-channel MOS transistor with a very short channel and a drift region between the channel and drain. The fabrication method allows channel lengths of the order of one micrometer. The method to produce this very narrow channel length is by diffusing a P-type impurity, such as boron, through the same mask opening that the N source diffusion will subsequently be diffused through. The result of this double diffusion in the source region is the creation of a narrow P-type region in series with the source region. This P-type region makes the channel length appear shorter than its actual length. The result is that the devices deliver more current than standard devices and allows the design of higher performance logic circuits.

The double diffused MOS field effect device can be made on P− minus substrates. However, performance is improved significantly if the major portion of the channel is N-type. The basic structure, under these circumstances, i.e. with an N-type substrate, contains no electrical isolation between devices. Isolation schemes similar to those used for bipolar devices are applicable but increase substantially the processing complexity, decrease the yield, and decrease the density of the integrated circuits.

SUMMARY OF THE PRESENT INVENTION

In accordance with the present invention, a method is described for fabricating double diffused-like MOSFET devices which utilize P-type substrates and thereby retain the natural isolation advantage of conventional MOS field transistor devices. In addition, the performance advantage of N-type channels is attained.

The method for making MOS field effect transistor devices having an electrically shorter appearing channel length than its physical length involves first forming an inorganic masking layer on one surface of a P-type monocrystalline silicon body. Openings are made in the masking layer in the areas designated to be source of the device. P-type ions are then implanted into these areas by utilizing an intentionally shallow implant. The body is heated to drive-in the P-type ions laterally into the regions which will be the channels of the devices. Openings are then provided in the areas designated as the drain of the device. N-type ions are then implanted into the source and drain regions simultaneously by utilizing an intentionally deep implant. The result of this N-type implant is that the N-type ions overcome the P-type ions in number to form an N-type source region. However, the P-type region that was driven laterally from the edge of the source opening and is within the channel of the device is unaffected by the N-type ions. Finally, suitable metallurgy is applied to connect the elements of the transistor to form the desired MOSFET device.

The short channel MOSFET device thus formed is electrically an enhancement type of device, i.e. the device is turned off at zero gate bias (assuming application of a negative substrate potential if deemed desirable). The sequence of process steps to be outlined below allows the formation of a depletion type of device as well, i.e. a device that is turned on and has a channel formed at zero gate bias. The process is thus an enhancement/depletion MOSFET process with a short channel double implanted enhancement device that is useful for building high performance enhancement/depletion MOSFET circuits for logic, memory, and other applications.

DESCRIPTION OF THE PREFERRED EMBODIMENTS

Figure 1:
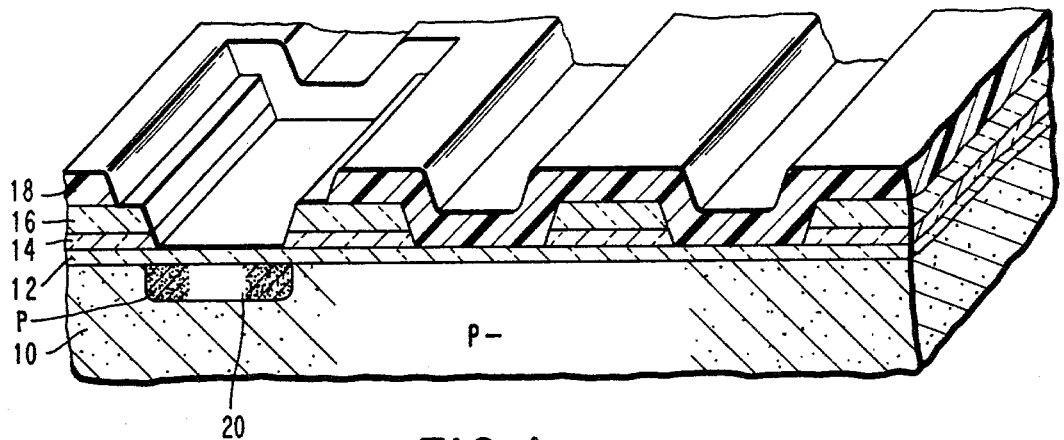
FIGS. 1–5 illustrate one form of the fabrication method of the present invention.

Referring now to the drawing and in particular to FIG. 1, there is shown a semiconductor body 10 of P− conductivity type. The semiconductor body is typically silicon having a resistivity of 10–20 ohm/cm and doping level of $10^{15}/cm^3$. A thin layer of silicon dioxide 12 is formed on the surface of the silicon body 10. A thin layer of silicon nitride 14 is formed on the silicon dioxide layer 12. A thicker layer of silicon dioxide 16 is formed on top of the silicon nitride layer 14. The layers 12, 14 and 16 comprise the masking layer of the process.

The silicon dioxide layers 12 and 16 may be formed by pyrolytic deposition, sputtering, or in the case of layer 12 by thermal growth. It is preferable to grow the layer 12 by the thermal method utilizing typical a temperature of 970° C. in wet oxygen. It is preferred to deposit the silicon dioxide layer 16 by the pyrolytic method by utilizing typically a temperature of 800° C. in a chemical vapor deposition (CVD) system.

The silicon nitride layer 14 may be formed by sputtering or pyrolytic deposition. It is preferable to form this layer by pyrolytic deposition utilizing typically a temperature of 800° C. in a chemical vapor deposition system.

The initial silicon dioxide layer 12 has a thickness of between about 400 to 500 Angstroms. The silicon nitride layer 14 has a thickness typically about 300 Angstroms. The silicon dioxide layer 16 has a preferred thickness of about 1000 Angstroms.

Openings are made in the masking layer over the regions which will become the sources and drains of the MOS field effect transistor devices. These openings are made in the masking layer through the CVD silicon dioxide and silicon nitride layers using suitable etchants for silicon dioxide and silicon nitride together with the well known photolithographic techniques. A photoresist layer 18 is deposited over the surface of the masking layer having openings therein, exposed and developed so as to mask all areas but those appropriate (enhancement device) source regions which have been designated as having the double diffused-like MOS field effect transistor device. In the case of FIG. 1, the lefthand opening is designated as the source opening for a double diffused-like MOSFET device. The middle opening which is covered with the photoresist layer 18 is designated as the drain for the double diffused-like MOS device and also the source for a depletion load device. The righthand opening which is covered with the photoresist layer 18 is designated as the drain for a depletion load device.

The surface of the device shown in FIG. 1 is subjected to a blanket ion bombardment via a P-type impurity, such as boron, a P-type ion dosage of between about $10^{11}$ to $10^{13}$ ions/cm$^2$ and at an energy of between about 10 to 100 keV is useful. The typical implantation dosage is $10^{12}$/cm$^2$ and 30 keV. The photoresist layer 18 prevents the passage of the P-type ions from reaching the silicon body 10. The silicon dioxide layer 12 is not sufficient in thickness to prevent the movement of ions through itself into the silicon body. Alternatively, the layer 12 need not be left on during ion implantation. The result of the ion implantation is the P-type region 20.

The photoresist layer 18 is removed. The semiconductor body is now annealed at a temperature of between about 1050° C. for 200–400 minutes in nitrogen atmosphere. The effect of the annealing is to thermally drive the P-type region 20 junction within the P-body 10 further in the P-body 10. Of particular importance is the movement of the junction laterally into the region which will ultimately be the channel of the double diffused-like device.

Figure 2:
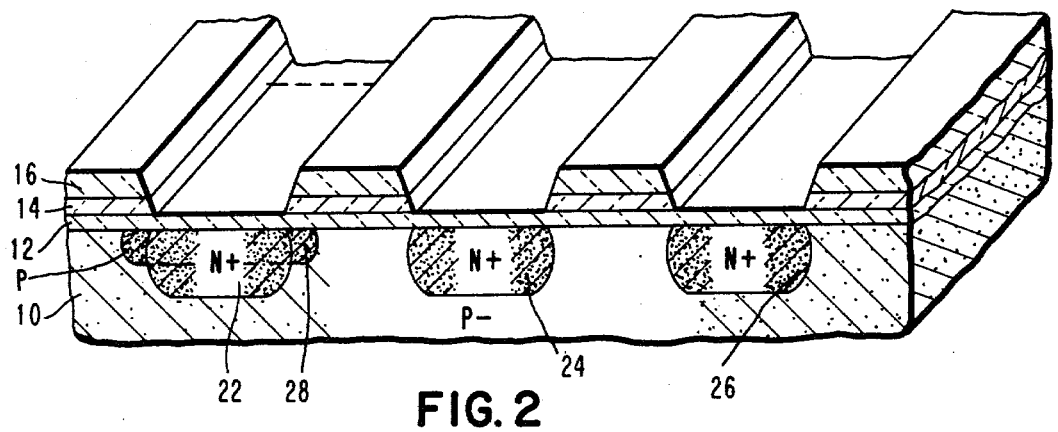
Figure 3:
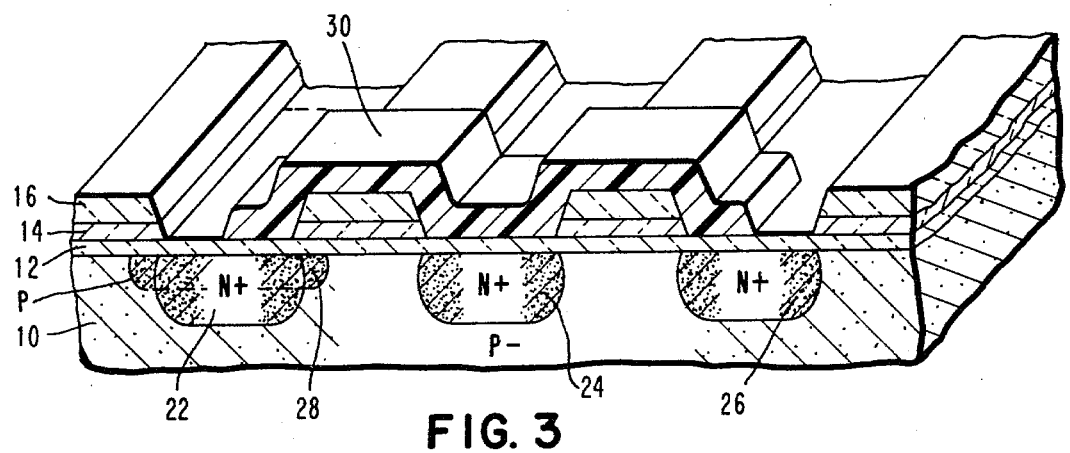

The surface of the device is now subjected to a blanket ion bombardment with an N-type impurity which results in the structure of FIG. 2. Region 22 is the source of the double diffused-like MOS device, region 24 in the drain of the double diffused-like device, region 26 is the drain of a depletion load device. It should be noted that region 24 will also be the source of the depletion load device. This N-type ion implantation overcomes the P-type dosage in region 20 except where the P-type region is within the channel region. This P-type channel region is designated as item 28. The useful length of the P-type channel region 28 after the processing is complete is about 0.3 to 3 micrometers with a typical length being 1 micrometer. The type of impurity for this source/drain ion implantation step can be typically phosphorus or arsenic. The operative dosage is between about $1 \times 10^{15}$/cm$^2$ to $1 \times 10^{17}$/cm$^2$ with an energy of between about 120 to 180 keV. A typical dosage and energy for phosphorus is $5 \times 10^{15}$/cm$^2$ and 150 keV. Another photoresist layer 30 is applied to the surface of the semiconductor device being fabricated and using standard photolithography techniques and etching techniques is used to protect the areas of the devices which will be channels of the devices. The channel of the device is at the silicon surface extending between the source and drain regions. The width of the channel region is determined on the basis of the desired current flow in the devices. The structure is shown in FIG. 3.

The structure is now subjected to an appropriate etch for silicon dioxide which removes the CVD silicon dioxide 16 that is not covered by the photoresist 30. A typical etch for silicon dioxide is HF. The photoresist 30 is now stripped (removed) from the wafer exposing the CVD silicon dioxide 16 over the gate region. A blanket silicon nitride etch is now done using an appropriate etchant to remove all the silicon nitride 14 except that under the CVD silicon dioxide 16 over the gate region. Typically, hot $H_3PO_4$ is used as the etchant. The exposed silicon dioxide is no removed from the structure again using an appropriate etchant. This stem removes the thermal silicon dioxide 12 except over the gate region and also the CVD silicon dioxide 16 everywhere on the wafer. The silicon dioxide 12 and silicon nitride 14 over the gate regions is not removed during these etching steps and continues to define the gate region width.

Figure 4:
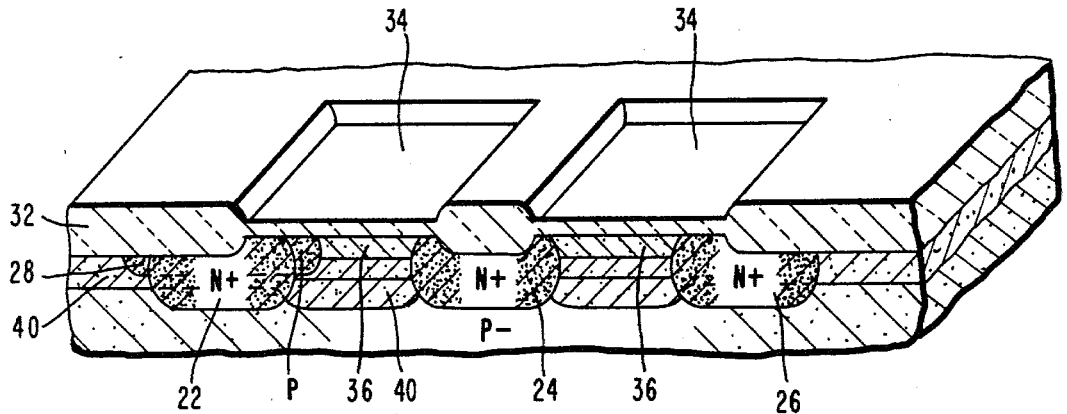

The structure is then subjected to a dry-wet-dry at 10-135-10 minutes oxidation at 970° C. to grow a thick field oxide region 32 of about 5000 to 7000 Å over the entire surface of the top surface of the structure except in the area of the channel regions which are protected against oxidation by the silicon nitride layer remaining there. These channel regions will later be covered by a thin dielectric and metal so as to form the gate regions of the MOSFET devices. There is no growth of the silicon dioxide over the channel regions because the oxygen cannot penetrate through the silicon nitride layers 14. The result of the oxidation is shown in FIG. 4. The silicon nitride layer 14 and silicon dioxide layer 12 is now removed from the channel region simply by dip etching in the appropriate silicon nitride etchant followed by silicon dioxide etchant. Suitable etchant for silicon nitride is hot $H_3PO_4$ and suitable etchant for silicon dioxide is liquid or vapor HF. The gate oxide is then regrown in an ambient of dry oxygen with 2% HCl at 970° for 55 minutes followed by 85 minutes in dry oxygen until the thickness of the oxide is between about 400 to 600 Angstroms. This regrown gate oxide is shown as element 34 in FIG. 4. A phosphorus silicate glass layer (not shown) of 50 to 100 Angstroms is deposited over the wafer. The purpose of the phosphorus silicate glass layer is to passivate the gate oxide layer against contamination by impurity atoms. The deposition process for the phosphorus silicate glass is a chemical vapor deposition at 800° C. using a POCl$_3$ source. An alternative to the gate oxide growth following the stripping of the silicon nitride layer 14 and silicon dioxide layer 12 is to leave these layers intact and use these layers themselves at the thin gate dielectric. The preferred embodiment is stripping the layers 14 and 12 and regrowing the oxide 34 and passivating with PSG as indicated.

It is sometimes advantageous at this point in the process to implant a depletion threshold adjustment region in the device structure. This is done by a blanket ion implantation of an N-type impurity such as phosphorus or arsenic, using a dosage of between about $10^{10}$ to $10^{12}$/cm$^2$ at an energy of 50 to 300 keV. Typical phosphorus dosage would be $1.5 \times 10^{11}$/cm$^2$ at 150 keV. The resulting depletion threshold adjustment region is region 36. The structure is then annealed at 1000°–1050° C. for 15 minutes to 1 hour to thermally drive in the threshold adjustment junction for phosphorus channel implant to a depth of approximately 0.5 micrometers. The depletion threshold adjustment implant pentrates the thin gate oxide region 34 but does not penetrate the thick field oxide region 32.

Another optional implantation is the field protection ion implantation. The surface of the FIG. 4 device is subjected to an ion bombardment by a P-type impurity. Boron ions may be used to bombard the semiconductor at a suitable energy sufficient to produce the region 40 underlying the silicon dioxide region 32 and the channel region 34. For example, a boron ion dosage of $2 \times 10^{12}/cm^2$ at an energy of 150 keV can be used. The structure is then annealed to thermally drive in the field protection junction at a temperature of about 900°–1000° C. for a time of 10–20 minutes. The purpose of the field protection is to prevent parasitic field effect devices, i.e. undesirable surface channels, in the region under the field oxide 32 and to prevent parasitic punch-through or bulk leakage currents from occurring between sources and drains under the gate region 34. The resulting structure is that of FIG. 4.

Figure 5:
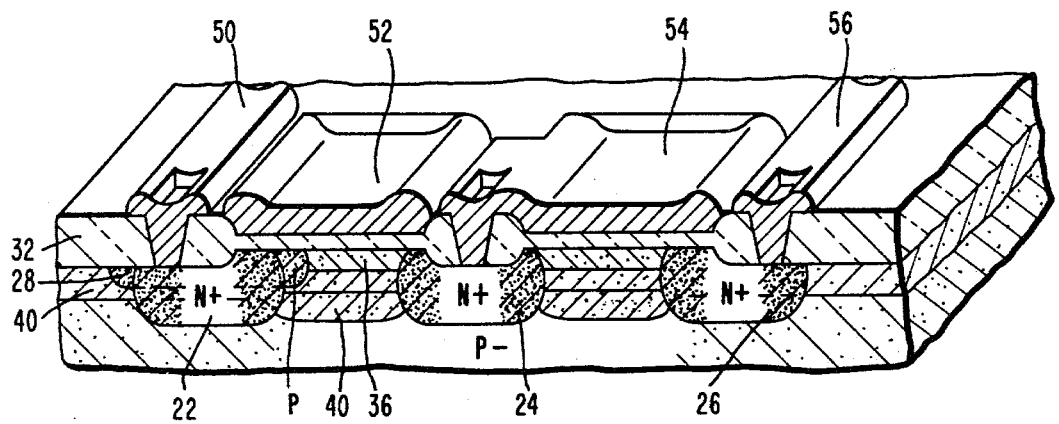

Photoresist is then applied to the surface of the device and suitable photolithographic and etching steps are utilized to form openings in the field oxide layer 32 for the source and drain contacts to the device. The photoresist is then removed and a blanket layer of aluminum metal is evaporated onto the entire surface of the structure. The metal is then annealed for approximately 20 to 30 minutes at 400° C. in forming gas or nitrogen. The metal conductive pattern is then defined by suitable photolithographic etching steps to produce the desired contacts to the source and drain and the metal gate electrodes as shown in FIG. 5. Metal line 50 contacts the source of the double diffused-like MOSFET device, metal line 56 contacts the drain of a depletion MOSFET device, metal land 52 forms the gate of the double diffused-like MOSFET device, and metal land 54 forms the gate of the depletion device and also contacts the drain of the double diffused-like MOSFET device and the source of the depletion MOSFET device. The resulting FIG. 5 structure is a double diffused-like MOSFET device (enhancement type) on the left in series with a depletion load device on the right.

An alternate metallurgy to that described above is a polysilicon gate metallurgy. The self-aligned polysilicon gate process and corresponding device structure which is practiced generally in the industry can be applied to the double diffused-like MOSFET technique as previously described, i.e. a double ion implant of P-type and N-type impurities through the source opening and a blanket depletion adjustment implant, so as to obtain a structure similar to that shown in FIG. 5 but with a polysilicon gate material rather than metal as shown in FIG. 5. Both the metal gate version shown in FIG. 5 and the corresponding polysilicon gate version are self-aligned gate structures which minimizes the overlap gate capacitance and contributes to high performance in logic and memory circuits when built from these structures.

Figure 6:
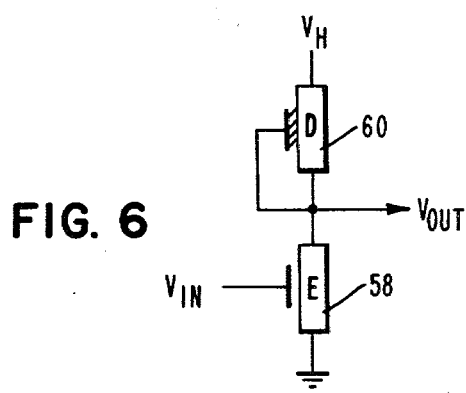
FIG. 6 illustrates the circuit configuration of the FIG. 5 device.

The configuration of a double diffused-like (enhancement) MOSFET device in series with a depletion MOSFET device shown in FIG. 5 is pictured schematically in FIG. 6. The structure, as shown, forms an inverter circuit. The double diffused-like device 58 has its gate connected to the input $V_{in}$, its source connected to electrical ground, and its drain connected to the output $V_{out}$. The depletion device 60 has its gate and source connected to the output $V_{out}$ and its drain connected to the power supply $V_H$ which would be a positive voltage with respect to ground for the N-channel embodiment described previously. Not shown in FIG. 6 is the substrate bias connection which connects the P— substrate and consequently the individual device substrates, to a supply voltage of ground or preferably a potential more negative than ground. The circuit of FIG. 6 is representative of a general class of enhancement/depletion logic circuits that can be built with the process and structure described herein. Other types of circuits, of course, can also be built. The circuit will be improved in performance over a standard enhancement/depletion logic circuit due primarily to the electrically short channel and physically small dimensions obtained in the double diffused-like MOSFET (enhancement) device. The advantages obtained are the following: The input capacitance of the double diffused-like device 58 will be reduced since the device can be made smaller for equal current conduction. This reduces loading capacitance in the logic circuitry. The device is physically small and allows high density circuits to be built. The double diffused-like device has low capacitance between its source and the substrate, due to the structure of regions 20, 22 and 28, which allows higher performance to be obtained in source follower and transmission gate type of circuits. The process is compatible with the depletion device process so that the double diffused-like enhancement and standard depletion devices are obtained in the same process sequence with no increase in the number of masking operations over a typical standard enhancement/depletion process.

The invention was described with the preferred embodiment being an N-channel MOSFET device technology. However, the extension to a P-channel MOSFET device technology is possible and follows from the process sequence described. Starting with an N-substrate and reversing all dopant types, the natural isolation could be obtained.

While the invention has been particularly described with reference to the preferred embodiments thereof, it will be understood by those skilled in the art that the foregoing and other changes in form and details may be made therein without departing from the spirit and scope of the invention.

What is claimed is:

1. In a metal-oxide-semiconductor field-effect transistor comprising
   a semiconductor body of a first conductivity type and having a relatively light first dopant concentration,
   a pair of mutually-spaced source and drain regions of opposite conductivity type and formed within said body adjacent the surface thereof,
   means to make electrical contact to said source and drain regions,
   an enhancement channel region of said first conductivity type and having a relatively heavy dopant concentration higher than said first concentration,
   a depletion channel region of said opposite conductivity type,
   conrol means adjacent said depletion channel region,
   said enhancement channel region extending from said source region in a direction toward said drain region,
   said depletion channel region extending from said enhancement channel region to said drain region,
   the improvement wherein:

a field protection region of said first conductivity type and having a dopant concentration higher than said first concentration extends between said pair of mutually-spaced source and drain regions beneath said depletion channel region, and said source region is formed within said enhancement channel region and extends to a greater depth than the latter and into said semiconductor body so that a portion of the peripheral area of the source region is adjacent to and forms a junction with said semiconductor body, whereby the source-to-substrate capacitance of the device is determined primarily by the relatively light dopant concentration of said body instead of the relatively heavy dopant concentration of said enhancement channel region, thereby providing substantially increased speed of operation.

2. In a metal-oxide-semiconductor field-effect transistor comprising a semiconductor body of a first conductivity type and having a relatively light first dopant concentration, a pair of mutually-spaced source and drain regions of opposite conductivity type and formed within said body adjacent the surface thereof, means to make electrical contact to said source and drain regions, an enhancement channel region of said first conductivity type and having a relatively heavy dopant concentration higher than said first concentration, a further channel region of said opposite conductivity type, control means adjacent said further channel region, said enhancement channel region extending from said source region in a direction toward said drain region, said further channel region extending from said enhancement channel region to said drain region, the improvement wherein:

a field protection region of said first conductivity type and having a dopant concentration higher than said first concentration extends between said source and drain regions beneath said further channel region of opposite conductivity type, and said source region is located within said enhancement channel region and extends to a greater depth than the latter and into said semiconductor body, as to form a junction with said semiconductor body, whereby the source-to-substrate capacitance of the device is a function of the relatively light dopant concentration of said body.

3. In a metal-oxide-semiconductor field-effect transistor comprising a semiconductor body of a first conductivity type and a first dopant concentration, a pair of mutually-spaced source and drain regions of opposite conductivity type and formed within said body adjacent the surface thereof, means to make electrical contact to said source and drain regions, an enhancement channel region of said first conductivity type and having a second dopant concentration higher than said first concentration, a depletion channel region of said opposite conductivity type, control means adjacent said depletion channel region, said enhancement channel region extending from said source region in a direction toward said drain region, said depletion channel region extending from said enhancement channel region to said drain region, the improvement wherein:

a field protection region of said first conductivity type and having a dopant concentration higher than said first concentration extends between said pair of mutually-spaced source and drain regions beneath said depletion channel region, and said source region has a major portion of its peripheral area adjacent to and forming a junction with said semiconductor body and only a minor portion of its peripheral area adjacent said enhancement channel region, whereby the source-to-substrate capacitance of the device is a function of the relatively lower first dopant concentration of said body and is thereby reduced so as to provide substantially increased speed of operation.

4. In a metal-oxide-semiconductor field-effect transistor comprising a semiconductor body of a first conductivity type and a first dopant concentration, a pair of mutually-spaced source and drain regions of opposite conductivity type and formed within said body adjacent the surface thereof, means to make electrical contact to said source and drain regions, an enhancement channel region of said first conductivity type and having a second dopant concentration higher than said first concentration, a depletion channel region of said opposite conductivity type, control means adjacent said depletion channel region, said enhancement channel region extending from said source region in a direction toward said drain region, said depletion channel region extending from said enhancement channel region to said drain region, the improvement wherein:

a field protection region of said first conductivity type and having a dopant concentration higher than said first concentration extends between said pair of mutually-spaced source and drain regions beneath said depletion channel region, and said source region has a major portion of its peripheral area adjacent to and forming a junction with said semiconductor body and only a minor portion of its peripheral area adjacent said enhancement channel region;

whereby the source-to-substrate capacitance of the device is determined primarily by the relatively lower first dopant concentration of said body instead of the relatively higher dopant concentration of said enhancement channel region, thereby providing substantially increased speed of operation.

* * * * *